(12) United States Patent
Kim et al.

(10) Patent No.: US 7,355,324 B2
(45) Date of Patent: Apr. 8, 2008

(54) SILICON FILM BULK ACOUSTIC WAVE DEVICE AND PROCESS OF THE SAME

(75) Inventors: Hyeong Joon Kim, Gyeonggi-do (KR); Jae Bin Lee, Seoul (KR); Heung Rae Kim, Chungcheongbuk-do (KR); Ki Bong Yeo, Chungcheongbuk-do (KR); Young-Soo Lee, Chungcheongnam-do (KR)

(73) Assignee: Sangshin Elecom Co., Ltd, Chungcheongnam-do (KR)

( * ) Notice: Subject to any disclaimer, the term of this patent is extended or adjusted under 35 U.S.C. 154(b) by 0 days.

(21) Appl. No.: 10/565,255

(22) PCT Filed: Jul. 21, 2004

(86) PCT No.: PCT/KR2004/001814

§ 371 (c)(1),
(2), (4) Date: Jan. 19, 2006

(87) PCT Pub. No.: WO2005/008889

PCT Pub. Date: Jan. 27, 2005

(65) Prior Publication Data

US 2006/0186759 A1    Aug. 24, 2006

(30) Foreign Application Priority Data

Jul. 21, 2003   (KR) ............... 10 2003 0049728
Jul. 12, 2004   (KR) ............... 10 2004 0053959

(51) Int. Cl.
*H01L 41/08*    (2006.01)

(52) U.S. Cl. ............ 310/320; 310/324; 310/334

(58) Field of Classification Search ........ 310/320, 310/324

See application file for complete search history.

(56) References Cited

U.S. PATENT DOCUMENTS

| | | | | |
|---|---|---|---|---|
| 5,185,589 A * | 2/1993 | Krishnaswamy et al. | ... | 333/133 |
| 5,853,601 A * | 12/1998 | Krishaswamy et al. | ........ | 216/2 |
| 5,872,493 A * | 2/1999 | Ella | ............ | 333/191 |
| 6,586,861 B2 * | 7/2003 | Misu et al. | ............ | 310/324 |
| 7,094,678 B2 * | 8/2006 | Bradley | ............ | 438/612 |

\* cited by examiner

*Primary Examiner*—Mark Budd
(74) *Attorney, Agent, or Firm*—Ober/Kaler; Royal W. Craig

(57) ABSTRACT

The present invention relates to a film bulk acoustic wave device and a method of manufacturing the same, wherein comprising an acoustic reflective layer which is formed on a substrate by removing a sacrificial layer on the substrate and becomes an empty space; an oxidation protective film or etch protecting film which is formed in a pattern that divides a resonance region to form the acoustic reflective layer on the sacrificial layer; a thermal oxidation film which is formed by partially thermally oxidizing the sacrificial layer in an electrode region where the oxidation protective film or the etch protecting film is not formed; and a lower electrode, a piezoelectric thin film, and an upper electrode all of which are disposed on the thermal oxide. Further, the present invention is directed to a method of manufacturing the same.

7 Claims, 8 Drawing Sheets

SILICON FILM BULK ACOUSTIC WAVE DEVICE AND PROCESS OF THE SAME

TECHNICAL FIELD

The present invention relates to a silicon film bulk acoustic wave device and a method of manufacturing the same, and more particularly, to a film bulk acoustic wave device and a method of manufacturing the same, wherein a partial thermal oxidation process is used so that chemical mechanical polishing (CMP) processes can be omitted, production yield is enhanced, and c-axis preferred orientation of the piezoelectric thin film is enhanced, resulting in excellent acoustic characteristics.

BACKGROUND ART

Recently, film bulk acoustic wave devices (FBARs), and band-pass filters and duplexer filters using the same are currently being widely studied and developed as next generation components conforming to the trends of high frequency, high quality and miniaturization of mobile communications components.

Film bulk acoustic wave devices use a piezoelectric/inverse piezoelectric phenomenon of piezoelectric materials. The most ideal form thereof (i.e., air-gap form) has a simple structure of a piezoelectric thin film and an upper/lower electrode. Several methods for manufacturing a film bulk acoustic wave device having an ideal form (i.e., air-gap form), which is simple and has excellent resonance characteristics, have been suggested. The methods may be largely classified into micro electro mechanical system (MEMS) processes, bulk micromachining manufacture methods using backside etching, and surface micromachining manufacture methods based on two schemes of using a sacrificial layer after a substrate groove formation and of using a sacrificial layer on a substrate. In addition, there are device manufacture methods, such as solidly mounted resonator (SMR) methods using a Bragg reflector, high-overtone BAR (HBAR) methods using a low-loss substrate, and the like. Primarily, the surface micromachining method using a groove is being used. The SMR device is currently studied by some manufacturers. For the formation and removal of the sacrificial layer in the surface micromachining method, there are several patents on detailed techniques. For example, there are a number of methods, such as a method for forming and wet-etching a resonance structure outside a ZnO sacrificial layer; a method for laminating a sacrificial layer, forming a step-shaped support layer thereon, forming a resonance structure, and then removing the sacrificial layer; a method of manufacturing a resonator using a bridge structure, a method for forming a groove and forming a sacrificial layer therein, a method using deep silicon etching equipment, and the like.

A conventional method of manufacturing a film bulk acoustic wave device using the aforementioned surface micromachining process is a method of forming a groove having a depth of a few micrometers (μm) (i.e., an empty space functioning as an acoustic reflective layer) on a silicon substrate, depositing a sacrificial layer such as $SiO_2$ (BPSG, low temperature oxide (LTO)), Poly-Si, ZnO, etc. in a thickness of a few μm in the groove, mirror surface polishing the layer using a chemical mechanical polishing (CMP) process, and forming a film bulk acoustic wave device having a support layer/lower electrode/piezoelectric thin film/upper electrode structure thereon.

In the foregoing, in order to mirror surface polish the sacrificial layer, there is necessarily a need for a CMP process of two or more steps. In the first CMP process, planarization is conducted to reduce the step between the sacrificial layer and the etch protective region, and in the second CMP process, the sacrificial layer is mirror surface polished. This is because the surface of the sacrificial layer beneath a piezoelectric layer must be extremely smooth in order to reveal excellent piezoelectric characteristics by improving the c-axis preferred orientation of the piezoelectric layer, which is an essential part of the film bulk acoustic wave device formed by the CMP process.

Here, chemical mechanical polishing (CMP) refers to a process of planarizing a substrate or a sacrificial layer using both chemical reaction and mechanical polishing. A polisher is attached to a flat platen of high precision, slurry with polishing agent and chemical polishing solution being mixed is poured thereon, and a machined object is brought into friction with the polisher rotating through the platen rotation. With polishing agents and polishing solution therebetween, the machined object is polished by mechanical friction and is etched by chemical reaction. This mechanical-chemical actions cause a synergistic effect so that the object can be polished to a mirror surface.

A conventional CMP process refers to a process of first forming a groove by etching a substrate, depositing a sacrificial layer in the substrate, and smoothly polishing the entire substrate surface using a CMP process when manufacturing a bulk acoustic wave device. The first CMP process is a rough polishing process. It is a planarization task for causing the surface height of the sacrificial layer deposited in the groove and the surface height of the substrate to be generally similar to each other by removing the sacrificial layer deposited on the substrate other than the groove. The second CMP process is to smoothly polish the sacrificial layer portion deposited in the substrate groove. The second CMP is a very important process. Using this process, the surface of the sacrificial layer in the groove must be made extremely smooth. This is because when depositing any material, the substrate surface state as a base affects all the characteristics of a thin film as deposited. In particular, the c-axis preferred orientation of the piezoelectric element is a very important characteristic of the piezoelectric thin film. This characteristic is under direct influence from the surface roughness of the sacrificial layer. The smoother the sacrificial layer surface, the better the preferred orientation of the piezoelectric element. Accordingly, the device characteristics can be of high quality.

In a conventional method of manufacturing a film bulk acoustic wave device using the aforementioned surface micromachining process, a groove is formed in a portion of a substrate surface, a sacrificial layer is deposited therein, the sacrificial layer other than the groove is removed by a two-step CMP process, and the sacrificial layer filled in the groove remains. The sacrificial layer is a portion to be removed in a final process for the device, which is called 'sacrificial layer'.

Generally, in a case where a thin film is deposited on the substrate, the thin film may be monocrystalline (epitaxy), polycrystalline, and amorphous. In the case of a sputter deposition, it is easy to obtain a thin film of which the atoms are aligned in one-dimension when in a broad view, which is called epitaxial growth or preferred orientation. Generally, if the forward direction of crystalline directions from an arbitrary origin is set as an a-axis, the rightward direction is set as a b-axis, and the upward direction is set as a c-axis, the c-axis preferred orientation indicates that, when an AlN and ZnO thin film is formed on the substrate, the c-axes of the two materials are oriented perpendicular to the substrate surface.

The c-axis of a piezoelectric material used in the present invention corresponds to a piezoelectric axis (on which electrical and mechanical signals react most strongly). In the film bulk acoustic wave device, the c-axis preferred orientation of the piezoelectric material must be excellent to obtain a good piezoelectric effect of the piezoelectric element and thus to make a device having excellent resonance characteristics using the piezoelectric effect. Thus, the c-axis preferred orientation of the piezoelectric thin film is a very important characteristic.

Herein, a prior art for manufacturing a film bulk acoustic wave device will be specifically discussed. As described above, the manufacture method using surface micromachining is being widely used. This method may be classified into a method using a sacrificial layer after forming a substrate groove and a method using a sacrificial layer on a substrate.

First, the surface micromachining method (surface M/M 1) using the sacrificial layer after forming the substrate groove will be discussed. As shown in FIG. 10, it is a method that uses the sacrificial layer after forming a groove having a depth of a few μm in the substrate surface. This method is of a structure having a simpler process and higher yield as compared to bulk micromachining, and has been considered a substitution technology for the bulk micromachining method because of its mass-production. However, there is a problem with this method that a two-step CMP process is needed, a dishing effect exhibits upon the CMP process, and stress is focused on bent portions, resulting in micro-cracks.

In the case of using the aforementioned surface M/M 1, the CMP must proceed in two steps for smoothness of the sacrificial layer and the substrate surface after a substrate groove is formed and then a sacrificial layer is deposited therein in order to manufacture the film bulk acoustic wave device. In the first step, it is necessary to increase the rate of the CMP for removal of the sacrificial layer on the substrate and for smoothness between the substrate surface and the sacrificial layer surface in the groove. Thus, rough polishing will be conducted. However, if the surface of the remaining sacrificial layer is rough, the c-axis preferred orientation of the piezoelectric thin film is deteriorated when the piezoelectric thin film is deposited on the rough sacrificial surface. Thus, since it is necessary to make the surface of the remaining sacrificial layer smooth for the sake of the c-axis preferred orientation of the subsequent piezoelectric thin film, the surface of the remaining sacrificial layer is processed to be further smoothed by adding a two-step CMP process.

However, after the two-step CMP process is undertaken to make the surface of the sacrificial layer smooth, a dishing effect is shown. Here, the dishing effect is generated between materials having different material quality, such as between the substrate and the sacrificial layer. Since the sacrificial layer is a material with weaker property than that of the substrate, it is much more highly polished compared to the substrate at the same polishing condition. The sacrificial layer is much more polished into a sunken shape when viewed from the substrate surface. A heavily sunken layer leads to micro-crack generation, sacrificial layer removal problems, and stiction problems as described below.

Further, all mechanical destruction occurs as cracks propagated from micro-cracks. Accordingly, even though it is important to prevent the propagation of cracks, it is essentially important to block micro-cracks from occurring. Micro-cracks occur most frequently at portions on which the stress of the thin film may be focused. In particular, physically bent portions or interface portions require careful attention because most of the stress is focused thereon. Accordingly, the use of curved portions, rather than bent portions whenever possible prevents the concentration of stress and the occurrence and propagation of micro-cracks. In FIG. 10, there is shown a portion where the substrate remains and a portion where the sacrificial layer is removed into an air layer. Therefore, in the process of removing the sacrificial layer, stress is necessarily generated at its interface and such a portion will physically be weak.

Next, the surface micromachining method (surface M/M 2) using the sacrificial layer on the substrate will be discussed. As shown in FIG. 11, it is a method depositing and using the sacrificial layer in a thickness of a few micrometers (μm) on the substrate surface. This method is the same as the surface micromachining method using the sacrificial layer after forming the substrate groove in that the process proceeds near the substrate surface, but is different from it in that the device is manufactured by using the sacrificial layer patterned on the substrate while using the substrate as it is. Such formation of the sacrificial layer pattern on the substrate eliminates the need for a groove to be formed on the substrate, resulting in a shortened manufacture process. However, there is a problem in that a lower electrode is positioned at a sacrificial layer position from the substrate and an upper electrode is positioned at piezoelectric element height from the lower electrode and, as such, the higher the electrode is formed from the substrate surface, the more difficult the process becomes, and a parasitic effect arises. In other words, there is a risk that a portion with a bent electrode has a parasitic effect in a circuitry aspect and causes an electrical short in a physical aspect. Upon depositing a metal, because a top surface and a side surface are not deposited to have the same thickness but the top surface has a much greater deposit than the side surface, there is a likelihood that the side is not connected electrically, resulting in a short-circuit. The surface M/M 2 method has a problem that stress is focused on bent portions, resulting in micro-cracks. In particular, since the bent portions are present at two places of the lower electrode and the upper electrode, an inferior physical structure is obtained.

Further, in the case of using the surface M/M 2, a stiction risk arises upon removing the sacrificial layer. Stiction means that the thin film remaining after the sacrificial layer removal and the substrate portion stick to each other. Easily speaking, for example, in water, even though two large-area glass plates are made to face each other, they remain in a separated state. On the contrary, out of the water, the two glass plates strongly stick due to surface tension and capillary action, which may be referred to as stiction. In conventional surface micromachining methods, because the sacrificial layer is present beneath the piezoelectric thin film and on the substrate, this structure is immersed in etching solution, which melts only the sacrificial layer, such that only the sacrificial layer is removed from the structure. If the sacrificial layer is removed and then the device is taken out of the etching solution, the etching solution is gradually removed between the piezoelectric thin film and the substrate and then the piezoelectric thin film and the substrate are strongly stuck to each other. This phenomenon is called stiction. Occurrence of stiction obstructs the normal operation of the device. A process of removing the sacrificial layer without stiction may be the most difficult process in the manufacture of a film bulk acoustic wave device. In the surface micromachining method using the sacrificial layer on the substrate, the sacrificial layer has a height of approximately a few micrometers (μm), the piezoelectric thin film has a thickness of about 1 μm, and the piezoelectric element has a suspending length of about 200 μm. Therefore, there is a problem that when a structure is formed in which the piezoelectric thin film having a length of 200 μm and a thickness of 1 μm is suspended at a position of about 3 μm from the substrate, stiction easily may occur and the piezoelectric thin film may be bent and stuck to the substrate.

In the case of manufacturing a film bulk acoustic wave device using the surface micromachining method as described above, there is a problem that the two-step CMP process is necessary, a dishing effect is shown upon the CMP process, and micro-cracks occur at bent portions on which stress is focused. Further, a parasitic effect and stiction risk upon the sacrificial layer removal may arise. As such, the process is very difficult in the conventional surface micromachining method because the manufacture process is complex, and productivity of the film bulk acoustic wave device is poor because process time is long.

In the case of manufacturing the lower electrode or upper electrode using a single molybdenum electrode as in a prior art, an additional etching process is needed to etch an oxide film of the molybdenum electrode. Further, if the electrode is exposed to the air in a post-process, the electrode is easily oxidized. Accordingly, electrode resistance increases, complete oxidation of the molybdenum oxide is difficult, and re-oxidation may occur. There is another problem that if the molybdenum electrode is over-etched to completely etch the oxide, the mass loading effect causes a heavy shift of the resonance frequency. The use of noble metal material having less acoustic loss, such as platinum (Pt) or the like, as an electrode material to avoid this problem greatly increases production costs.

Here, the resonance frequency of the film acoustic wave device basically depends on spacing between two electrodes, namely, the thickness of the piezoelectric element, and if the electrodes are brought into contact with each other for applying an electrical signal, the electrodes reduce the resonance frequency, which is called mass loading. In general, the resonance frequency lowers and, for a gold (Au) electrode, the resonance frequency sometimes lowers to 60% of the theoretic value. Since an aluminum electrode has a much smaller mass loading effect, the use of aluminum electrodes to obtain the same resonance frequency may result in a thicker piezoelectric element thin film as compared to the use of other material electrodes.

In a conventional process for manufacturing film bulk acoustic wave devices, the sacrificial layer is removed to complete a structure of the film bulk acoustic wave devices, and the film bulk acoustic wave devices formed on the substrate are then cut by a sawing method, wherein a lid-shaped protecting structure must be formed of, for example, a glass plate to protect the film bulk acoustic wave devices. In the foregoing, the protecting structure is needed for preventing cooling water upon sawing or residues created upon cutting from affecting the structure of the film bulk acoustic wave devices. However, there is a need for a process of removing the protecting structure from the respective bulk elastic plate devices after cutting, and this process is very complex, resulting in degraded mass productivity of the film bulk acoustic wave devices.

As another cutting method, there is a bulk micromachining process of forming cracks on the back surface of the substrate prior to a film bulk acoustic wave device manufacture process, and cutting the substrate using the cracks through application of mechanical force after the film bulk acoustic wave device is formed on the substrate. However, even in this cutting method, the process is difficult, the film bulk acoustic wave device is applied with physical impact, and mass productivity is not good.

DISCLOSURE OF INVENTION

The present invention is conceived to solve the aforementioned problems. An object of the present invention is to provide a film bulk acoustic wave device manufactured using a sacrificial layer with excellent surface smoothness so that a CMP process can be omitted. In particular, if the sacrificial layer is deposited and used, a film bulk acoustic wave device can be manufactured using all kinds of smooth insulating substrates.

Another object of the present invention is to provide a method of manufacturing a film bulk acoustic wave device, wherein since a thermal oxidation film with a smooth surface is formed using a simple and efficient method instead of a CMP process, production yield is improved and the c-axis preferred orientation of piezoelectric thin film is greatly improved, whereby a film bulk acoustic wave device with excellent characteristics can be manufactured.

Further, a further object of the present invention is to provide a method of manufacturing a film bulk acoustic wave device with a dual electrode, wherein deposition is made in a thickness of thousands of angstroms (Å) using a material such as molybdenum with an excellent acoustic characteristic and then coating is made with a material such as platinum, gold or the like in a thickness of hundreds of angstroms (Å) or less to prevent oxidation. In particular, depositing aluminum (Al) having a low mass loading effect and excellent electrical conductivity in a thickness of thousands of angstroms (Å) and using it as a first electrode structure allows a piezoelectric thin film deposited thereon to be thick, thereby allowing the piezoelectric thin film to have improved c-axis orientation. As a result, the resonance characteristics of the device can be improved and the process management thereof can be easily made, and production yield can be increased.

Further, a still further object of the present invention is to provide a method of manufacturing a film bulk acoustic wave device, wherein a cutting process is simplified by using photoresist as a protective film for the film bulk acoustic wave device.

In order to solve the aforementioned problems, the present invention proposes a compatible cutting process of forming a partial thermal oxidation film using a polycrystalline silicon material as a sacrificial layer, and patterning and removing the sacrificial layer.

According to an aspect of the present invention, there is provided a film bulk acoustic wave device, comprising an acoustic reflective layer which is formed on a substrate by removing the sacrificial layer on the substrate and becomes an empty space, an oxidation protective film or etch protecting film which is formed in a pattern that divides the resonance region to form the acoustic reflective layer on the sacrificial layer, a thermal oxidation film which is formed by partially thermally oxidizing the sacrificial layer in an electrode region where the oxidation protective film or etch protecting film is not formed, a lower electrode, a piezoelectric thin film, and an upper electrode all of which are disposed on the thermal oxidation film.

The acoustic reflective layer is formed by forming the sacrificial layer on the substrate, forming the thermal oxidation film on the sacrificial layer structure, and removing the sacrificial layer.

According to another aspect of the present invention, there is provided a film bulk acoustic wave device, comprising a silicon substrate, an oxidation protective film or etch protecting film which is formed in a pattern of dividing a resonance region to form an acoustic reflective layer on the silicon substrate, a thermal oxidation film which is formed by partially thermally oxidizing the silicon substrate in an electrode region where the oxidation protective film or etch protecting film is not formed, and a lower electrode, a piezoelectric thin film and an upper electrode all of which are disposed on the thermal oxidation film.

The acoustic reflective layer is formed by using a method of forming the oxidation protective film on the silicon substrate without depositing the substrate protecting film and the sacrificial layer, partially thermally oxidizing the silicon substrate in a direct manner, and using a thermally non-oxidized portion of silicon substrate as the sacrificial layer.

According to a further aspect of the present invention, there is provided a film bulk acoustic wave device including lower and upper electrodes on a substrate, wherein the lower or upper electrode comprises a first electrode layer formed by depositing a conductive material having less acoustic loss and good electrical conductivity in a thickness of thousands of angstroms (Å), and a second electrode layer formed by depositing a noble metal material having low electrical resistance and thus less loss due to resistance in a thickness of hundreds of angstroms (Å) or less on the first electrode layer to prevent the first electrode layer from being oxidized.

In the first electrode or the upper electrode, the first electrode layer is composed of molybdenum, aluminum, silver or copper, and the second electrode layer is composed of platinum or gold.

According to a still further aspect of the present invention, there is provided a method of manufacturing a film bulk acoustic wave device, comprising the steps of forming a sacrificial layer of Poly-Si or Si on a substrate; forming a thermal oxidation film by oxidizing the sacrificial layer in portions except for a portion where the acoustic reflective layer is to be formed; forming an etch protecting film of silicon oxide or silicon nitride on the sacrificial layer in a predetermined thickness; forming a lower electrode by depositing a conductive material in a predetermined pattern on the etch protecting film and the thermal oxidation film; forming a piezoelectric thin film by depositing a material with piezoelectric characteristics in a predetermined pattern on the lower electrode and the thermal oxidation film; and forming an upper electrode by depositing a conductive material in a predetermined pattern on the piezoelectric thin film.

The oxide film forming step may comprise the steps of forming an oxidation protective film of silicon nitride film in a thickness of hundreds to thousands of angstroms (Å) on the sacrificial layer only in a portion in which the acoustic reflective layer is to be formed; forming the thermal oxidation film by partially thermally oxidizing the sacrificial layer in a portion where the oxidation protective film is not formed; and removing the oxidation protective film.

According to a still further aspect of the present invention, there is provided a method of manufacturing a film bulk acoustic wave device, comprising the steps of forming a thermal oxidation film on a substrate by oxidizing the substrate in portions except for a portion where the acoustic reflective layer is to be formed; forming an etch protecting film of silicon oxide or silicon nitride on the substrate in a predetermined thickness; forming a lower electrode by depositing a conductive material in a predetermined pattern on the etch protecting film and the thermal oxidation film; forming a piezoelectric thin film by depositing a material with piezoelectric characteristics in a predetermined pattern on the lower electrode and the thermal oxidation film; and forming an upper electrode by depositing a conductive material in a predetermined pattern on the piezoelectric thin film.

The oxide film forming step may comprise the steps of forming an oxidation protective film of silicon nitride film in a thickness of hundreds to thousands of angstroms (Å) on the silicon layer only in a portion in which the acoustic reflective layer is to be formed; forming the thermal oxidation film by partially thermally oxidizing the sacrificial layer in a portion where the oxidation protective film is not formed; and removing the oxidation protective film.

According to a still further aspect of the present invention, there is provided a method of manufacturing a film bulk acoustic wave device, comprising the steps of forming a sacrificial layer of Poly-Si or Si on a substrate; forming a lower electrode by depositing a conductive material in a predetermined pattern on the sacrificial layer; forming a piezoelectric thin film by depositing a material with piezoelectric characteristics in a predetermined pattern on the lower electrode and a thermal oxidation film; forming an upper electrode by depositing a conductive material on the piezoelectric thin film in a predetermined pattern; forming a lower electrode/piezoelectric layer/upper electrode and then cutting and separating the substrate for each film bulk acoustic wave device; and forming an acoustic reflective layer, which is an empty space, by removing the sacrificial layer for each cut and separated film bulk acoustic wave device.

The step of cutting a substrate and the step of forming an acoustic reflective layer may be included in one process for the manufacture of the film bulk acoustic wave device chip. In other words, the device cutting process is made not by an additional process after removing the sacrificial layer and completing a chip but prior to the sacrificial layer removing process.

According to a still further aspect of the present invention, there is provided a method of manufacturing a film bulk acoustic wave device, comprising the steps of forming a sacrificial layer of Poly-Si or Si on a substrate; forming a thermal oxidation film by oxidizing the sacrificial layer in portions except for a portion where the acoustic reflective layer is to be formed; forming an etch protecting film of silicon oxide or silicon nitride on the sacrificial layer in a predetermined thickness; forming a lower electrode by depositing a conductive material in a predetermined pattern on the etch protecting film and the thermal oxidation film; forming a piezoelectric thin film by depositing a material with a piezoelectric characteristic in a predetermined pattern on the lower electrode and the thermal oxidation film; forming an upper electrode by depositing a conductive material in a predetermined pattern on the piezoelectric thin film; forming a lower electrode/piezoelectric layer/upper electrode and then cutting and separating the substrate for each film bulk acoustic wave device; and forming the acoustic reflective layer, which is an empty space, by removing the sacrificial layer for each cut and separated film bulk acoustic wave device.

Preferably, the step of forming an oxide film, the step of cutting a substrate, and the step of forming an acoustic reflective layer are successively performed in one process. With the oxide film forming process according to the present invention, the CMP process is omitted, thereby obtaining an excellent smoothed surface. In addition, with the cutting step and the acoustic reflective layer forming step according to the present invention, the device is not affected from pollution and physical impact during the device cutting task, thereby increasing production yield in the stable manufacture process.

BRIEF DESCRIPTION OF DRAWINGS

These and other objects and features of the present invention will be apparent to those skilled in the art from the following description of embodiments of the present invention given in conjunction with the accompanying drawings, in which.

BEST MODE FOR CARRYING OUT THE INVENTION

Hereinafter, preferred embodiments of a film bulk acoustic wave device and a method for fabricating the same according to the present invention will be described in detail with reference to the accompanying drawings.

Figure 1:
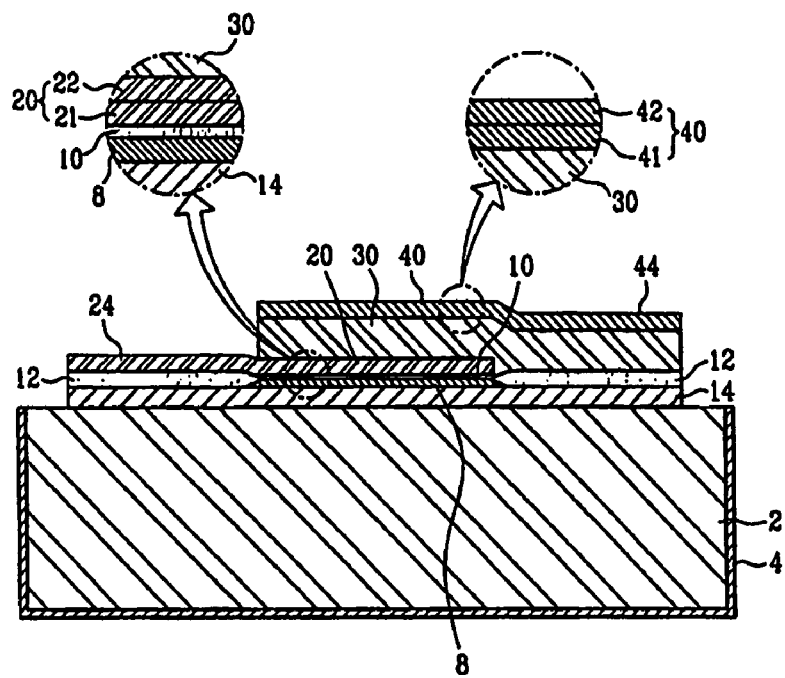
FIG. 1 is a sectional view illustrating an embodiment of a film bulk acoustic wave device according to the present invention.
Figure 8:
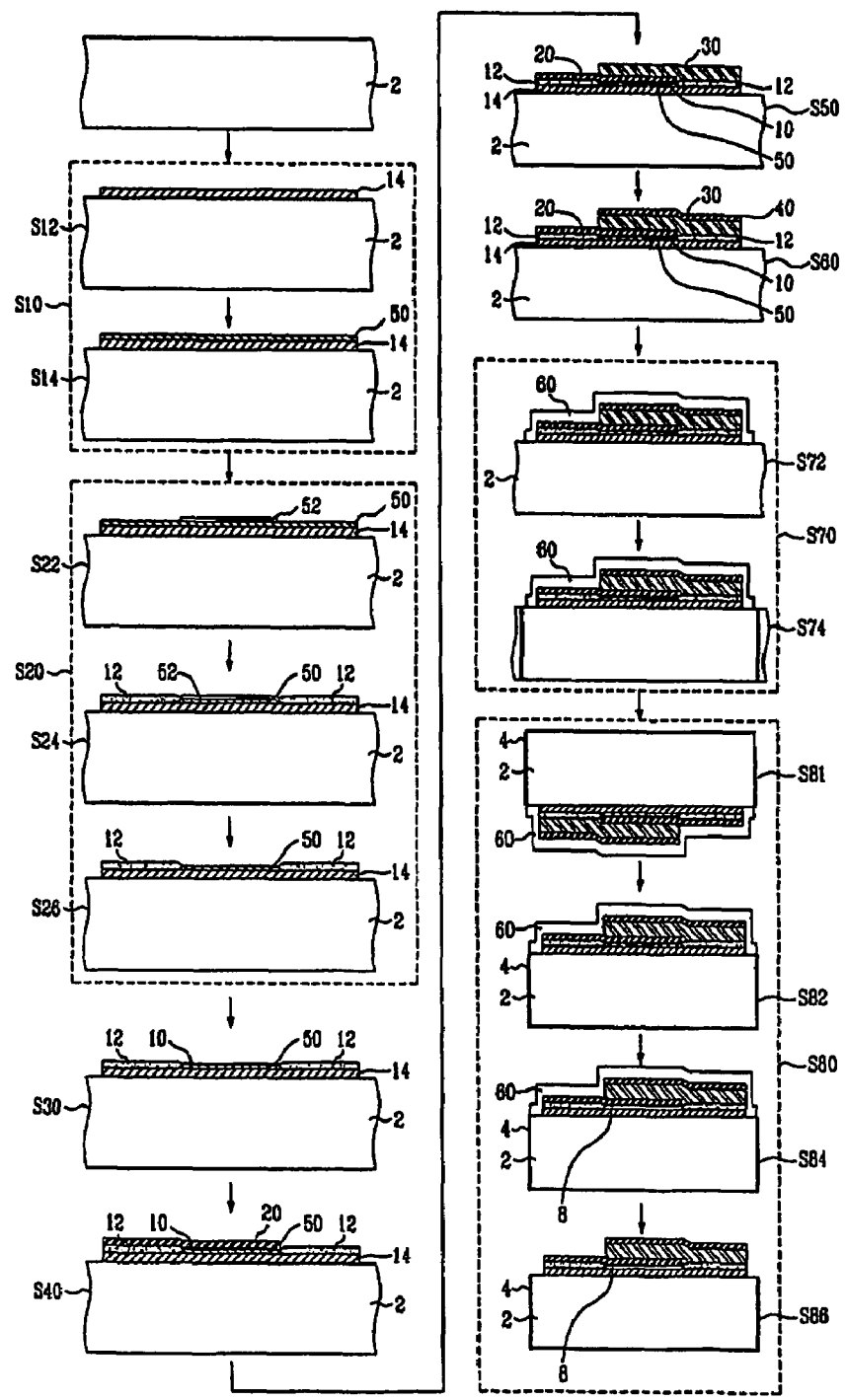
FIG. 8 is a process diagram illustrating in a sectional view an embodiment of a method of manufacturing a film bulk acoustic wave device according to the present invention.

First, a film bulk acoustic wave device according to an embodiment of the present invention, as shown in FIGS. 1 and 8, comprises an acoustic reflective layer 8 formed on a substrate 2 by removing a sacrificial layer 50 on the substrate, the acoustic reflective layer 8 corresponding to an empty space; an oxidation protective film 52 or an etch protecting film 10 formed in a pattern that divides a resonance region to form the acoustic reflective layer 8 on the sacrificial layer; a thermal oxidation film 12 formed by partially thermally oxidizing the sacrificial layer in an electrode region where the oxidation protective film or the etch protecting film is not formed; a lower electrode 20 and an upper electrode 40 formed by depositing a conductive material in a predetermined pattern on the thermal oxidation film; and a piezoelectric thin film 30 formed by depositing a material with a piezoelectric characteristic in a predetermined shape and a thickness between the lower electrode 20 and the upper electrode 40.

The most important technical characteristic of the present invention is to manufacture the device by forming a pattern (a thermally non-oxidized portion remains as the sacrificial layer to be removed later for forming an acoustic reflective layer, and a thermally oxidized portion remains as a support layer to the end) using a partial thermal oxidation method for silicon or polysilicon in the formation of the sacrificial layer 50.

In general, the method for forming the sacrificial layer includes a method for laminating the sacrificial layer, and a method for forming a groove in on a substrate and then inserting the sacrificial layer into the groove. However, since both methods need a number of subsequent processes such as a CMP process and have minor effects such as poor smoothness, the present inventor deposits the sacrificial layer 50 and introduces a partial thermal oxidation process to easily form and remove the sacrificial layer, as well as to achieve an excellent smooth surface.

At this time, it is preferable to use, for example, a Si substrate or a $SiO_2$ substrate as the substrate 2 used in the present invention, and to form a substrate protecting film 14 for preventing the substrate 2 from being etching or damaged in the course of forming an acoustic reflective layer 8 between the oxidation protective film 52 or the etch protecting film 10/thermal oxidation film 12 and the substrate 2.

The substrate protecting film 14 is composed of a silicon oxide film ($SiO_2$) or a silicon nitride film ($Si_3N_4$) formed in a thickness of a few to tens of micrometers ($\mu m$) using, for example, a physical vapor deposition (PVD) method or a chemical vapor deposition (CVD) method.

As a result, the device is manufactured by depositing the substrate protecting film 14 on the silicon substrate, depositing the sacrificial layer (Si, Poly-Si) 50 thereon, forming the oxidation protective film 52 in part in the resonance region, and partially thermally oxidizing the sacrificial layer in an electrode region having no oxidation protective film. An advantage of forming the substrate protecting film 14 between the substrate 2 and the sacrificial layer 50 is that the film bulk acoustic wave device can be formed in the method according to the present invention by coating the substrate protecting film on the substrate and depositing the silicon sacrificial layer thereon whether a substrate is a silicon substrate or a substrate of any other material.

Therefore, according to the present invention, the film bulk acoustic wave device is possible, which is characterized by using a sacrificial layer substrate structure composed of a silicon-silicon oxide film-silicon because the sacrificial layer formed on the substrate has a structure composed of a protective film for a silicon oxide film or silicon nitride film substrate and a silicon or polysilicon sacrificial layer on the silicon substrate.

Figure 12:
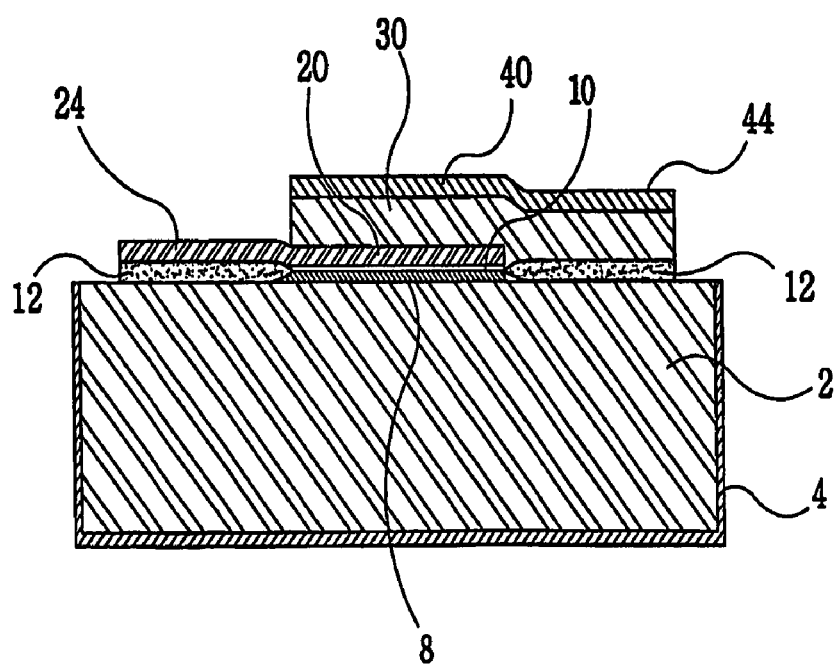
FIG. 12 is a sectional view illustrating a further embodiment of a film bulk acoustic wave device according to the present invention.

Further, the present invention has a technical characteristic of forming a pattern by using a partial thermal oxidation method for silicon or polysilicon. Accordingly, as a film bulk acoustic wave device according to another embodiment of the present invention, as shown in FIG. 12, a device is possible which is manufactured using a thermally non-oxidized portion in the substrate as the sacrificial layer, wherein an oxidation protective film is formed on the silicon substrate 2 without depositing the substrate protecting film 14 and the sacrificial layer 50 and then the silicon substrate is partially thermally oxidized in a direct manner. An advantage of partially thermally oxidizing the silicon substrate 2 in a direct manner as stated above is that a piezoelectric element thin film having excellent c-axis orientation is easily formed without a CMP process of two steps or the like since the silicon substrate itself has the most smooth surface roughness as compared to forming a lower electrode on any deposition film.

Therefore, according to the present invention, the film bulk acoustic wave device is provided, which includes an oxidation protective film 52 or an etch protecting film 10 formed in a pattern of dividing a resonance region to directly form an acoustic reflective layer 8 on the silicon substrate 2; a thermal oxidation film 12 formed by partially thermally oxidizing the silicon substrate in an electrode region where the oxidation protective film or the etch protecting film is not formed; and a lower electrode 20, a piezoelectric thin film 30 and an upper electrode 40 on the thermal oxidation film.

A film bulk acoustic wave device is desirable, which is characterized by, after the thermal oxidation film is formed using the partial thermal oxidation method for the sacrificial layer or the silicon substrate as described above, removing the oxidation protective film to increase side smoothness of the sacrificial layer or silicon substrate, and forming an etch protecting film in a thickness of hundreds of to thousands of angstroms (Å) on the sacrificial layer with the oxidation protective film being removed by using silicon oxide, nitride or the like.

In addition, according to the present invention, a film bulk acoustic wave device is possible, which is characterized by, after the thermal oxidation film is formed, using the oxidation protective film as the etch protecting film instead of removing the oxidation protective film.

The device manufactured by removing the oxidation protective film and forming the etch protecting film has an advantage of improving surface smoothness, but has a disadvantage of further requiring a one-step process. On the other hand, a device using the oxidation protective film as the etch protecting film instead of removing the oxidation protective film has a simple process, but has a disadvantage of degraded surface smoothness as compared to the aforementioned method.

The oxidation protective film and the etch protecting film are both composed of silicon oxide or silicon nitride. The discrimination between the oxidation protective film and the etch protecting film is made from a point of view according each role in the manufacture step. It does not mean a difference in major technical configurations in the present invention.

The present invention forms a pattern using a partial thermal oxidation method for silicon or polysilicon in forming the sacrificial layer. The present invention is a film bulk acoustic wave device characterized by forming a thermal oxidation film by thermally oxidizing the electrode region until the electrode region, which is not protected by the protective film, is entirely oxidized using thermal oxidation equipment in a wet thermal oxidation method.

The thermal oxidation film, which forms the pattern using the partial thermal oxidation method, makes a film bulk acoustic wave device, characterized in that the thermal oxidation film is grown in a portion having no oxidation protective film, is not grown in a center portion where the oxidation protective film remains, and is formed in an inclined manner in an interface portion thereof, whereby the resonance region and the electrode region are interconnected with each other in a gentle slope.

Since the oxidation protective film blocks the intrusion of oxygen which is an oxidizing agent, the underlying portion is not oxidized. However, a portion having no oxidation protective film is susceptible to the oxygen intrusion, easily forming the thermal oxidation film. The interface portion has an inclined face as a result of oxygen diffusion. It is possible to obtain a desired oxide film configuration using the shape and oxidation conditions of the oxidation protective film, if necessary.

If the inclined interface portion of thermal oxidation film 12 is formed as described above, the resonance region and the electrode portion are interconnected to have a gentle slope, and accordingly, the lower electrode forming and sacrificial layer removing processes are effectively conducted. In other words, the electrode portion and the resonance portion of the lower electrode 20 are interconnected along the slope, resulting in a seamless direct connection, and there is no need for a separate process for connection between the pad portion 24 and the electrode portion.

According to the present invention, the generation and propagation of micro-cracks is essentially suppressed due to the gentle thickness change and slope of the thermal oxidation film.

Further, in another embodiment of the film bulk acoustic wave device according to the present invention, the present invention is a film bulk acoustic wave device characterized in that the lower electrode and the upper electrode are formed in a dual structure. The lower electrode and the upper electrode are each composed of a first electrode layer formed by depositing a conductive material having less acoustic loss and good electrical conductivity in a thickness of thousands of angstroms (Å); and a second electrode layer formed by depositing a noble metal material having low electrical resistance and thus less loss due to resistance in a thickness of hundreds of angstroms (Å) or less on the first electrode layer to prevent the first electrode layer from being oxidized.

What is important among the acoustic characteristics in the film bulk acoustic wave device using the acoustic reflective layer is acoustic loss. This is caused by a unique characteristic of a material itself, such as elastic viscosity of the material or the like. Because the acoustic reflective layer is used as an electrode, it must have good electrical conductivity and thus small electrical resistance. If the thickness of the electrode is thin, the acoustic characteristics become relatively less important while the electrical characteristics become relatively more important. Thus, the present invention manufactures a film bulk acoustic wave device composed of a multi-layer electrode structure.

According to a preferred embodiment of the present invention, the first electrode layer is formed of conventional molybdenum (Mo), or of silver (Ag), copper (Cu), or aluminum (Al) having excellent electrical conductivity, and the second electrode layer is formed of platinum or gold. In particular, the aluminum (Al) has a lower mass loading effect.

The conventional molybdenum electrode has been widely used because of its good acoustic characteristic, but has a problem that electrical resistance is easily increased because the molybdenum electrode is easily oxidized in air, forming oxide. What is obtained by covering a protective film so that the molybdenum electrode is not oxidized despite exposure to the air is a dual electrode according to the present invention. This dual electrode includes noble metal series that is not well oxidized.

With the dual electrode obtained by depositing noble metal series such as platinum or gold as the second electrode layer on the first electrode layer, such as molybdenum electrode or the like, as described above, the oxidation of the molybdenum electrode can be prevented during a post-process and when exposed in the air. Further, an additional process of dry-etching the molybdenum electrode can be omitted. Although the additional dry-etching process cannot completely remove the oxide film and the etching shifts the resonance frequency, the present invention solves this problem and simplifies the processes to be simultaneously performed in a single system.

Further, if the dual electrode is made using aluminum as the first electrode layer according to the present invention, it is possible to lower process costs because the aluminum is five times cheaper than molybdenum, and to lower the resistance of the electrode to less than a few to hundreds of milliohm (mΩ) because a conventional molybdenum electrode has resistance of a few to tens of ohms (Ω) while an aluminum electrode has high electrical conductivity. Further, because the mass loading effect is less, the shift of the resonance frequency is less. Consequently, since it is possible to increase the thickness of the piezoelectric element, it results in improved piezoelectric characteristics, facilitated processes management, and facilitated aluminum electrode and pattern formation.

Further, according to the present invention, the dual electrode is made using silver (Ag) or copper (Cu) having high electrical conductivity as the first electrode layer. The conventional molybdenum electrode has resistance of a few to tens of ohm (Ω). On the other hand, in the present invention, it is possible to lower resistance of the electrode to less than a few to hundreds of milliohm (mΩ) because the copper electrode has high electrical conductivity.

The lower electrode 20 is formed in a smaller area than that of the piezoelectric thin film 30 to be covered with the piezoelectric thin film 30. The upper electrode 40 is also formed in a smaller area than that of the piezoelectric thin film 30 to be formed only in a portion where the piezoelectric thin film 30 is formed.

In the foregoing, it is preferred that overlapping portions between the lower electrode 20 and the upper electrode 40 be formed to have the same area at positions where they correspond to each other with the piezoelectric thin film 30 placed therebetween, which provides an optimal resonance characteristic.

Figure 2:
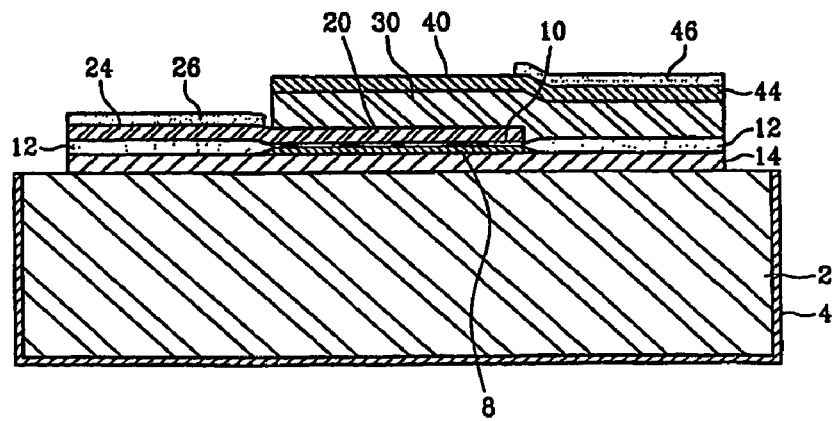
FIG. 2 is sectional view illustrating another embodiment of a film bulk acoustic wave device according to the present invention.
Figure 3:
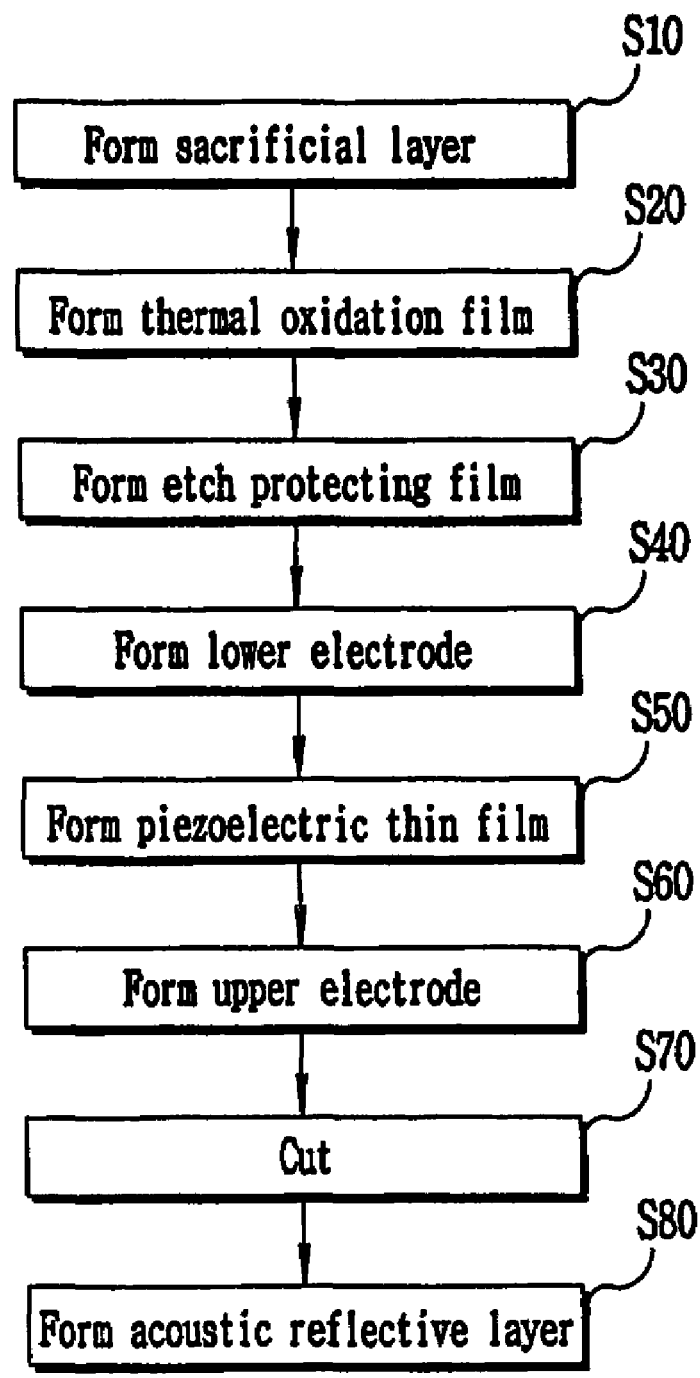
FIG. 3 is a block diagram illustrating an embodiment of a method of manufacturing a film bulk acoustic wave device according to the present invention.

As shown in FIG. 2, it is also possible to deposit and form respective reinforcing electrodes 26 and 46 in a thickness of a few micrometers (μm) on the pad portions 24 and 44 of the lower electrode 20 and the upper electrode 40 in order to reduce conduction losses.

The reinforcing electrodes 26 and 46 are formed by depositing aluminum (Al), copper (Cu), or the like, which has small electrical resistance and is inexpensive, in a thickness of a few micrometers (μm), and depositing a noble metal such as platinum (Pt), gold (Au) or the like in a thickness of hundreds of angstroms (Å) to prevent oxidation and facilitate wire bonding.

The reinforcing electrodes 26 and 46 is deposited and formed on the pad portions 24 and 44 of the lower electrode 20 and the upper electrode 40 using an electro plating deposition method, an electroless plating deposition method, an evaporation deposition method, a sputtering deposition method, or the like, after the upper electrode 40 is formed.

Zinc oxide (ZnO), aluminum nitride (AlN), or lead zirconium titanate (PZT) thin film, or the like is used as a material with piezoelectric characteristics that forms the piezoelectric thin film 30.

The piezoelectric thin film 30 is deposited and formed using a high-frequency magnetron sputter deposition method, a DC pulse magnetron sputter deposition method, an atom layer deposition method, a sol-gel deposition method, or the like.

The thickness of the piezoelectric thin film 30 is set depending on the desired frequency. This thickness must be exactly set to 0.5 times the wavelength of the film bulk acoustic wave.

Next, a method of manufacturing the film bulk acoustic wave device according to the present invention configured as described above will be described.

The method of manufacturing the film bulk acoustic wave device according to an embodiment of the present invention includes, as shown in FIGS. 1, 3, 8 and 9, a sacrificial layer forming step S10 of forming the sacrificial layer 50 of Poly-Si, Si or the like on the substrate 2; an oxide film forming step S20 of forming the thermal oxidation film 12 by oxidizing the sacrificial layer 50 in portions except for a portion where the acoustic reflective layer 8 to be formed; a protecting film forming step S30 of forming the etch protecting film 10 of oxide, nitride, or the like on the sacrificial layer 50 in a predetermined thickness; a lower electrode forming step S40 of forming the lower electrode 20 by depositing a conductive material in a predetermined pattern on the etch protecting film 10 and the thermal oxidation film 12; a piezoelectric thin film forming step S50 of forming the piezoelectric thin film 30 by depositing a material with a piezoelectric characteristic in a predetermined pattern on the lower electrode 20 and the thermal oxidation film 12; and an upper electrode forming step S60 of forming the upper electrode 40 by depositing a conductive material in a predetermined pattern on the piezoelectric thin film 30.

Figure 9:
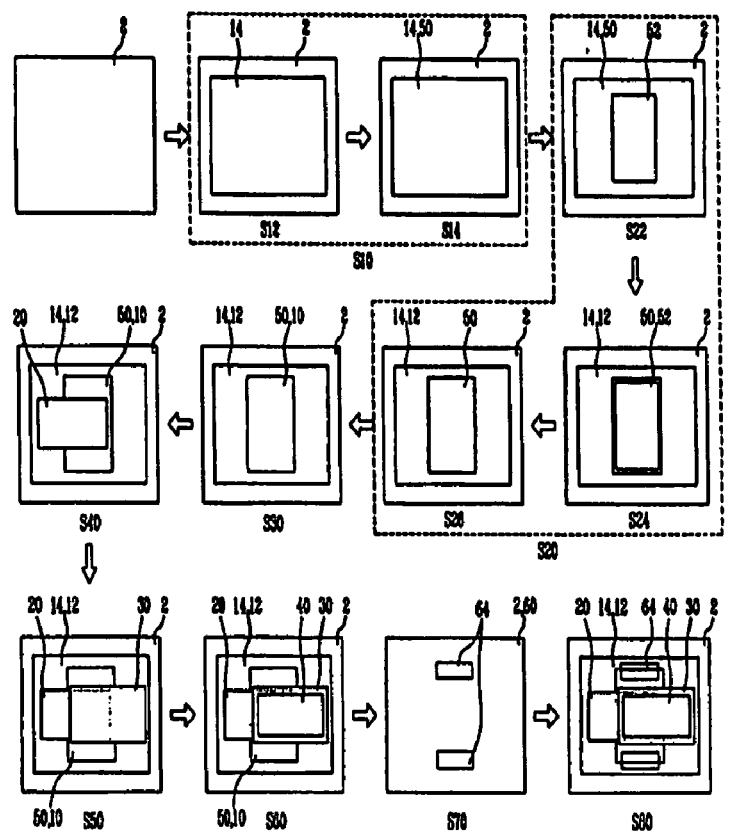
FIG. 9 is a process diagram illustrating, in a plan view, an embodiment of a method of manufacturing a film bulk acoustic wave device according to the present invention.
Figure 10:
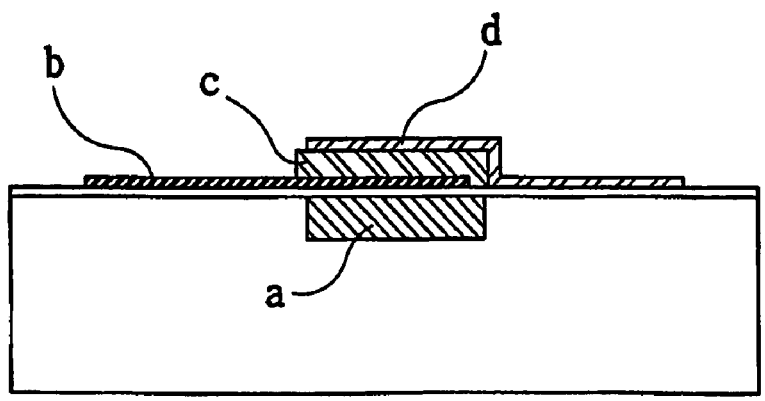
FIG. 10 is a sectional view illustrating a film bulk acoustic wave device according to a conventional surface micromachining method (surface micromachining 1) using a sacrificial layer after forming a substrate groove.
Figure 11:
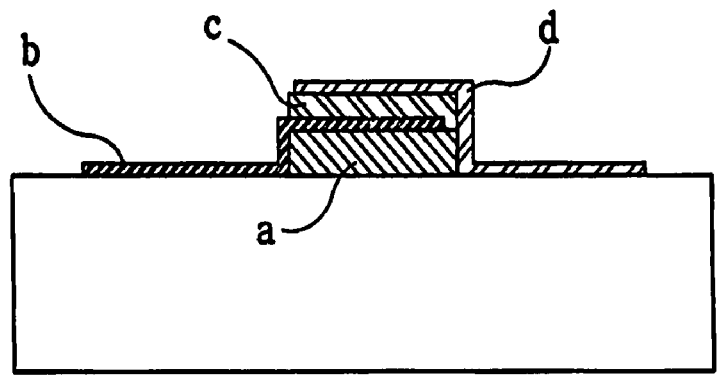
FIG. 11 is a sectional view illustrating a film bulk acoustic wave device according to a conventional surface micromachining method (surface micromachining 1) using a sacrificial layer on a substrate.

The sacrificial layer forming step S10, as shown in FIGS. 8 and 9, includes a step S12 of forming the substrate protecting film 14 by cleaning the substrate 2 and forming a silicon oxide film ($SiO_2$), a silicon nitride film ($Si_3N_4$), or the like in a thickness of a few to tens of micrometers (μm) using a physical vapor deposition (PVD) method, a chemical vapor deposition (CVD) method, or the like; and a step S14 of forming the sacrificial layer 50 of Poly-Si, Si or the like on the substrate protecting film 14.

The substrate protecting film 14 can be formed of an oxide film ($SiO_2$) having a thickness of 1 μm deposited, for example, using a Low Pressure CVD (LPCVD).

The substrate protecting film 14 is formed to prevent portions other than the sacrificial layer 50 from being damaged in the process of etching the sacrificial layer 50 or related processes. For example, if the substrate is a Si substrate 2, the substrate protecting film 14 is formed to prevent the substrate 2 from being etched in the process of removing the sacrificial layer 50.

The sacrificial layer 50 is formed by depositing polysilicon (Poly-Si) in a thickness of thousands of angstroms (Å) or more, for example, using a CVD method or a PVD method.

The pattern of the sacrificial layer 50 (or, pattern of the acoustic reflective layer 8) is formed in the oxide film forming step S20. The oxide film forming step S20 is composed of a step S22 of forming the oxidation protective film 52 of silicon nitride film ($Si_3N_4$) or the like on the sacrificial layer 50 only in a portion in which the acoustic reflective layer 8 is to be formed; a step S24 of forming the thermal oxidation film 12 by partially thermally oxidizing the sacrificial layer 50 in a portion where the oxidation protective film 52 is not formed; and a step S26 of removing the oxidation protective film 52.

The thermal oxidation film 12 functions as an etch protecting film when the sacrificial layer 50 is removed.

In the foregoing, the deposition thickness of the sacrificial layer 50, which is deposited in a thickness of thousands of angstroms (Å) or more, is set by considering oxidation easiness of the surface upon the thermal oxidation at the oxide film forming step S20, removal speed of the sacrificial layer 50 upon removing the sacrificial layer 50, and the like.

The silicon oxide film or nitride film used for stress-relief upon thermal oxidation at the oxide film forming step S20 may be formed in a thickness of 300 to 500 angstroms (Å). At this time, the stress-relief silicon oxide film or nitride film is formed of O2, N2, TCE, or the like at about 1,000° C. using an LPCVD method.

The oxidation protective film 52 must be first formed in a pattern shape of dividing the resonance region (i.e., region where Poly-Si or Si is not thermally oxidized but remains to the end so that the region is used as the sacrificial layer 50) and the electrode region (i.e., region where Poly-Si or Si is changed into the thermal oxidation film 12 and which is not removed upon removing the sacrificial layer 50) after the stress-relief silicon oxide film is formed and before the thermal oxidation film 12 is formed.

The oxidation protective film 52 requires a material that has excellent etching selectivity with silicon thermal oxidation film 12, is not destroyed upon forming the thermal oxidation film 12, and can block oxygen supply. It is preferable to deposit the oxidation protective film 52 using a low stress silicon nitride film deposited in a similar process to the silicon process.

The low stress silicon nitride film is grown and formed of $H_2$, a Si supply material ($SiH_4$), or an N supply material ($NH_3$, etc) in a thickness of approximately hundreds of to thousands of angstroms (Å) (e.g., 800 to 2,000 angstroms (Å)) in an about 1,000° C. furnace.

The resonance region and the electrode region are defined on the low stress silicon nitride film formed described above using a photoresist process (e.g., photoresist coating/exposing/developing). The oxidation protective film 52 is formed by removing the low stress silicon nitride film in a portion except for the resonance region using a wet etching method (using phosphoric acid) or a dry etching method (using RIE, ICP, etc.).

The oxidation protective film 52 serves to block oxygen supply in the silicon thermal oxidation process and suppress the growth of the thermal oxidation film 12 on the resonance region.

The thermal oxidation film 12 is formed by thermally oxidizing portions (the electrode region and the like), which are not protected by the oxidation protective film 52, until the portions are all oxidized by the wet thermal oxidation method using the thermal oxidation equipment. At this time, the silicon thermal oxidation film 12 is grown in a portion having no oxidation protective film 52, is not grown in a center potion where the oxidation protective film 52 remains, and is grown in an inclined manner in the interface portion thereof. This is because it is difficult for oxygen particles to diffuse as the oxygen particles move from the interface portion of the oxidation protective film 52 to the center portion thereof, in which the oxygen particles must be diffused into the silicon to grow the silicon thermal oxidation film.

If the thermal oxidation film 12 is formed with the interface portion being inclined as described above, the resonance region and the electrode portion are interconnected in a gentle slope so that the lower electrode forming process and the sacrificial layer removing process are conducted effectively. In other words, the electrode portion of the lower electrode 20 and the resonance portion are interconnected along the slope, resulting in a seamless direct connection, and do not need a separate process for connecting the pad portion 24 to the electrode portion.

After the thermal oxidation film 12 is formed, the oxidation protective film 52 is removed, and the etch protecting film 10 is formed of silicon oxide, nitride, or the like in a thickness of hundreds of angstroms (Å) on the sacrificial layer 50 from which the oxidation protective film 52 is removed. Although the etch protecting film 10 has been described as being formed separately, the present invention is not limited to it and the oxidation protective film 52 can be used as the etch protecting film 10 instead of removing the oxidation protective film 52.

Since the etch protecting film 10 or the oxidation protective film 52 formed as formed above already maintains a very smooth surface, there is no need for the CMP process. For the silicon substrate, because the silicon substrate has the best surface smoothness, the silicon substrate is not smooth as compared to the initial surface thereof even though the groove is formed in the substrate, the sacrificial layer is deposited, and then the CMP process of two or more steps is performed. Accordingly, the use of a portion of the silicon substrate as the sacrificial layer eliminates the need of the CMP process since the sacrificial layer has the smoothest surface. Thus, two-step CMP process omission in the present invention is a key characteristic in the process in which the silicon substrate is partial thermally oxidized, and at this time, the silicon substrate portion that is not thermally oxidized is used as the sacrificial layer to manufacture the device.

In the manufacture of the device when the sacrificial layer is deposited on the silicon substrate, since it is a method for partially thermally oxidizing the deposited sacrificial layer in which the thermally oxidized sacrificial layer portion and thermally non-oxidized sacrificial layer portion form a gentle slope, needing no particular CMP. However, a one-step CMP polishing (mirror surface polishing) process suffices to further smooth the surface of the deposited sacrificial layer, and this process is much simpler than the two-step CMP process.

Because the etch protecting film 10 or the oxidation protective film 52 formed as described above has a surface smoother than that of the substrate subjected to the conventional CMP process, it is possible to obtain a piezoelectric thin film 30 having very excellent c-axis preferred orientation by growing the piezoelectric thin film 30 on the thin lower electrode 20, and the thin etch protecting film 10 or oxidation protective film 52 formed thereon.

Further, a method of manufacturing a film bulk acoustic wave device according to another embodiment of the present invention, as shown in FIG. 12, includes an oxide film forming step S20 of forming the thermal oxidation film 12 by oxidizing the silicon substrate 2 on the silicon substrate 2 in portions except for a portion where the acoustic reflective layer 8 is to be formed; a protecting film forming step S30 of forming the etch protecting film 10 of oxide, nitride or the like in a predetermined thickness on the sacrificial layer 50; a lower electrode forming step S40 of forming the lower electrode 20 by depositing a conductive material in predetermined pattern on the etch protecting film 10 and the thermal oxidation film 12; a piezoelectric thin film forming step S50 of forming the piezoelectric thin film 30 by depositing a material with piezoelectric characteristics in a predetermined pattern on the lower electrode 20 and the thermal oxidation film 12; and an upper electrode forming step S60 of forming the upper electrode 40 by depositing a conductive material in a predetermined pattern on the piezoelectric thin film 30.

Detailed descriptions on the lower electrode forming step S40, the piezoelectric thin film forming step S50, and the upper electrode forming step S60 will be omitted since each of the steps can be carried out using, for example, a photo etching process, which is extensively used in typical semiconductor manufacture processes.

In the lower electrode forming step S40 and/or upper electrode forming step S60, the first electrode layers 21 and 41 are formed by depositing a conductive material having an excellent acoustic characteristic (i.e., less acoustic loss) and good electrical conductivity, such as molybdenum (Mo), aluminum (Al), silver (Ag), copper (Cu) or the like, in a thickness of approximately thousands of angstroms (Å) (e.g., 2,000 to 4,000 Å). The first electrode layer has a disadvantage that electrical resistance increases because it is easily oxidized when exposed in air, resulting in oxide. To prevent oxidation, a noble metal material capable of preventing the oxidation of the first electrode layers 21 and 411, namely, platinum (Pt) or gold (Au), is deposited in a thickness of hundreds of angstroms (Å) using the second electrode layers 22 and 42. At this time, two processes of the deposition of the first electrode layer and the deposition of the second electrode layer are successively performed in the same chamber at a vacuum maintenance state.

A molybdenum electrode, which has Been conventionally used because of less acoustic loss and high electrical conductivity, is easily oxidized. For this reason, in the existing process in which the lower electrode and the upper electrode should be necessarily exposed to the air after formed, the oxidation of the molybdenum electrode cannot be avoided. So, an additional plasma etching method has been conventionally conducted. However, the mass loading effect causes this additional etching to shift in resonance frequency. It is difficult to completely remove the oxide film, and a likelihood of re-oxidation always exists. Therefore, the present invention can fully solve the aforementioned problem by depositing a noble metal material capable of preventing oxidation, such as platinum (Pt), gold (Au) or the like, in a thickness of approximately hundreds of angstroms (Å) on the electrode.

According to the present invention, the deposition of aluminum material in forming the lower electrode or the upper electrode is a method using, as the first electrode layers 21 and 41, aluminum (Al), which has a lower mass loading effect on the electrode, and high electrical conductivity and accordingly small electrical resistance, and which is inexpensive. The use of an aluminum electrode allows the piezoelectric film of aluminum nitride (AlN), or the like that is one of piezoelectric materials, to have a larger thickness since the mass loading effect is less, in addition to the aforementioned advantages. The greater the thickness of the piezoelectric film, the more piezoelectric characteristics of the film increase. Further, the adjustment of processes is facilitated. In other words, in the case where the piezoelectric thin film is thinner and the case where it is thicker, the latter will have a smaller effect when the same thickness difference at the two cases arises due to any fault process.

Further, the deposition of silver (Ag) or copper (Cu) material upon forming the lower electrode or the upper electrode according to the present invention is because the lowest electrode resistance can be formed using a material having high electrical conductivity.

In the lower electrode forming step S40 and the upper electrode forming step S60, the pad portions 24 and 44 for connection with an external circuit to apply a power supply voltage to the lower electrode 20 and the upper electrode 40 are simultaneously formed integrally with the lower electrode 20 and the upper electrode 40.

Figure 7:
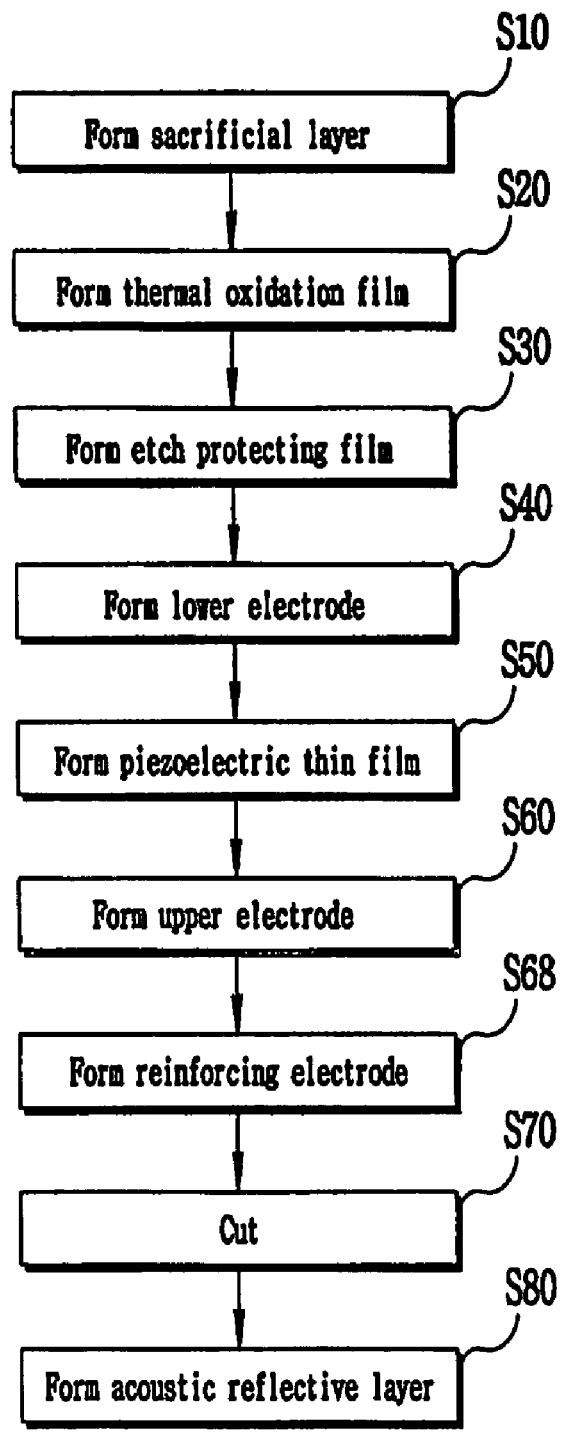
FIG. 7 is a block diagram illustrating another embodiment of a method of manufacturing a film bulk acoustic wave device according to the present invention.

The method of manufacturing a film bulk acoustic wave device according to an embodiment of the present invention can further include, as shown in FIGS. 2 and 7, a reinforcing electrode forming step S68 of depositing and forming each of the reinforcing electrodes 26 and 46 in a thickness of approximately a few micrometers (μm) on the pad portions 24 and 44 of the lower electrode 20 and the upper electrode 40 between the upper electrode forming step S60 and the cutting step S70 to reduce the loss of the conduction.

The reinforcing electrodes 26 and 46 are formed by depositing aluminum (Al), copper (Cu), or the like, which has small electrical resistance and is inexpensive, in a thickness of approximately a few micrometer (μm), and depositing a noble metal such as platinum (Pt), gold (Au) or the like in a thickness of approximately hundreds of angstroms (Å) to prevent oxidation and facilitate wire bonding.

The reinforcing electrodes 26 and 46 are formed on the pad portions 24 and 44 of the lower electrode 20 and the upper electrode 40 using an electro plating deposition method, an electroless plating deposition method, an evaporation deposition method, a sputtering deposition method, or the like.

In the foregoing, since the lower electrode 20 is formed on the etch protecting film 10 or the oxidation protective film 52, which is formed with the surface thereof being very smooth, it has a very smooth surface. Thus, the piezoelectric thin film 30 formed on a portion of the lower electrode 20 and a portion of the etch protecting film 10 has highly excellent c-axis preferred orientation.

The upper electrode 40 is formed of the same material and method as those of the lower electrode 20. A lift-off method, a directly etching method, or the like may be used upon forming the pattern of the upper electrode 40.

The piezoelectric thin film forming step S50 is composed of a process of depositing a material with piezoelectric characteristics, such as ZnO, AlN silicon nitride, aluminum nitride, PZT, or the like, on the etch protecting film 10 and the lower electrode 20 using a high frequency magnetron sputter deposition method, a direct current (dc) pulse magnetron sputter deposition method, an atom layer deposition method, a sol-gel deposition method, or the like to form a piezoelectric thin film, and of etching the formed piezoelectric thin film in a predetermined pattern using a photo etching process or the like.

The piezoelectric thin film 30 must have high resistivity, excellent c-axis preferred orientation, a smooth surface shape, and the like. The thickness of the deposited piezoelectric thin film 30 must be exactly adjusted to be 0.5 times the wavelength of the bulk acoustic wave corresponding to the operation frequency.

The piezoelectric thin film 30 may be formed in a predetermined pattern by forming the pattern of the upper electrode 40 and then etching the piezoelectric thin film 30 because of problems upon the process thereof, such as pollution or the like of the piezoelectric thin film 30 material or other electrodes, if necessary.

Further, a method of manufacturing a film bulk acoustic wave device according to another embodiment of the present invention, as shown in FIGS. 1, 3, 8 and 9, includes a sacrificial layer forming step S10 of forming the sacrificial layer 50 of Poly-Si or Si on the substrate 2; a lower electrode forming step S40 of forming the lower electrode 20 by depositing a conductive material in a predetermined pattern on the sacrificial layer; a piezoelectric thin film forming step S50 of forming the piezoelectric thin film 30 by depositing a material with a piezoelectric characteristic in a predetermined pattern on the lower electrode 20 and the thermal oxidation film 12; an upper electrode forming step S60 of forming the upper electrode 40 by depositing a conductive material on the piezoelectric thin film 30 in a predetermined pattern; a cutting step S70 of forming a lower electrode/piezoelectric layer/upper electrode (piezoelectric activation basic structure) and then cutting and separating the substrate 2 for each film bulk acoustic wave device; and an acoustic reflective layer forming step S80 of forming the acoustic reflective layer 8, which is an empty space, by removing the sacrificial layer 50 for each cut and separated film bulk acoustic wave device.

The cutting step and the acoustic reflective layer forming step are included as one process in the manufacture of the film bulk acoustic wave device chip. In other words, the device cutting process does not depend on a separate process after completing a chip by removing the sacrificial layer, but is included prior to the sacrificial layer removing process.

In the present invention, the device is completed by exposing a sacrificial layer etching window 64, cutting and cleaning the substrate, developing the photoresist layer, and then removing the sacrificial layer at the state where the photoresist (PR) is deposited. As such, the present invention has a simple process because the device cutting process is included as a partial process in the chip manufacture, not a separate process, after the chip is made. Further, the photoresist (PR) prevents the device from being contaminated with a created foreign material, such as residue created upon cutting the device, the foreign material can be removed through cleaning, such that device defects are lessened and thus production yield increases. Since the present invention includes the sacrificial layer removing process after the cutting process, it is a more stable as compared to other processes because it can endure some physical impact in the process. In particular, exposure to water upon sawing cutting does not affect device manufacture. In addition, the process is automated using a sawing cutting device or a laser cutting device.

Figure 4:
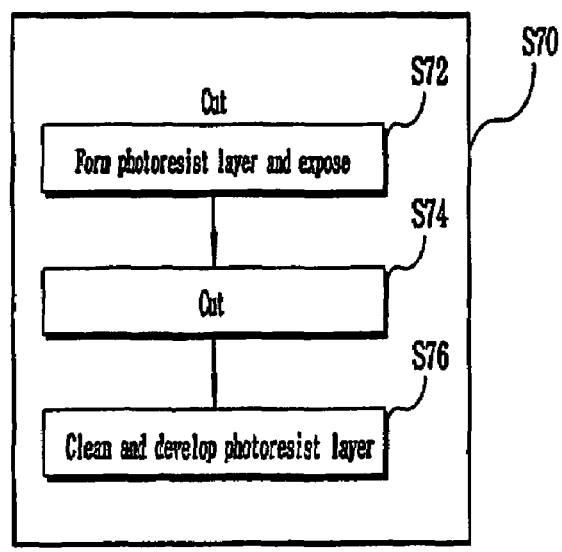
FIG. 4 is a block diagram illustrating a cutting step in an embodiment of a method of manufacturing a film bulk acoustic wave device according to the present invention.

The cutting step S70, as shown in FIGS. 4, 8 to 9, is composed of a step S72 of forming a basic piezoelectric activation structure of a lower electrode 20/piezoelectric thin film 30/upper electrode 40, and then forming and exposing a photoresist layer 60 so that the entire structure is covered and an etching window 64 is formed in part; a step S74 of cutting the substrate 2 for each film bulk acoustic wave device in a laser cutting method, a sawing cutting method, or the like; and a step S76 of performing cleaning to remove residue or a foreign material created from the cut devices and developing the photoresist layer 60.

The etching window 64 is for removing the sacrificial layer 50, and is a space into which etching solution for removing the sacrificial layer 50 is injected.

Figure 5:
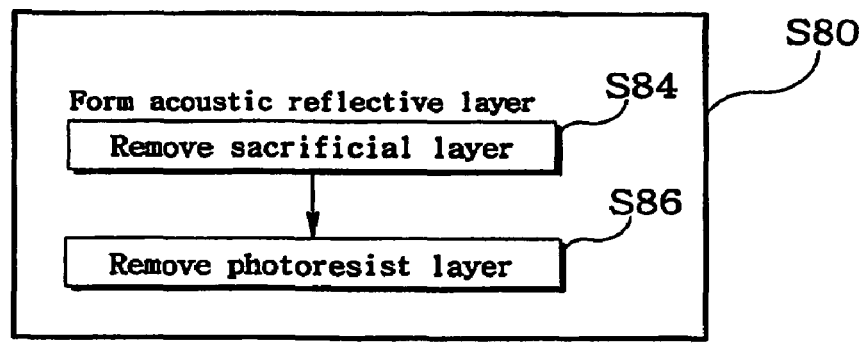
FIG. 5 is a block diagram illustrating an acoustic reflective layer forming step in an embodiment of a method of manufacturing a film bulk acoustic wave device according to the present invention.

The acoustic reflective layer forming step S80, as shown in FIGS. 5, 8, and 9, is composed of a step S84 of removing the sacrificial layer 50 through the etching window 64 for each film bulk acoustic wave device cut in the cutting step S70; and a step S86 of removing the photoresist layer 60.

In the foregoing, removal of the sacrificial layer 50 of Poly-Si or Si is made using a dry etching method, a wet etching method or the like. For example, the sacrificial layer 50 of Poly-Si or Si is removed, for example, using a $XeF_2$ Si isotropic etching device.

In the process of removing the sacrificial layer 50 as described above, the etch protecting film 10 prevents the piezoelectric activation basic structure from being damaged due to the etching material, and only the sacrificial layer 50 of Poly-Si or Si, which is positioned beneath the piezoelectric activation basic structure, is removed.

Removal of the sacrificial layer 50 as described above forms an empty space, which functions the acoustic reflective layer 8.

Removal of the photoresist layer 60 is conducted using, for example, an ashing process.

Figure 6:
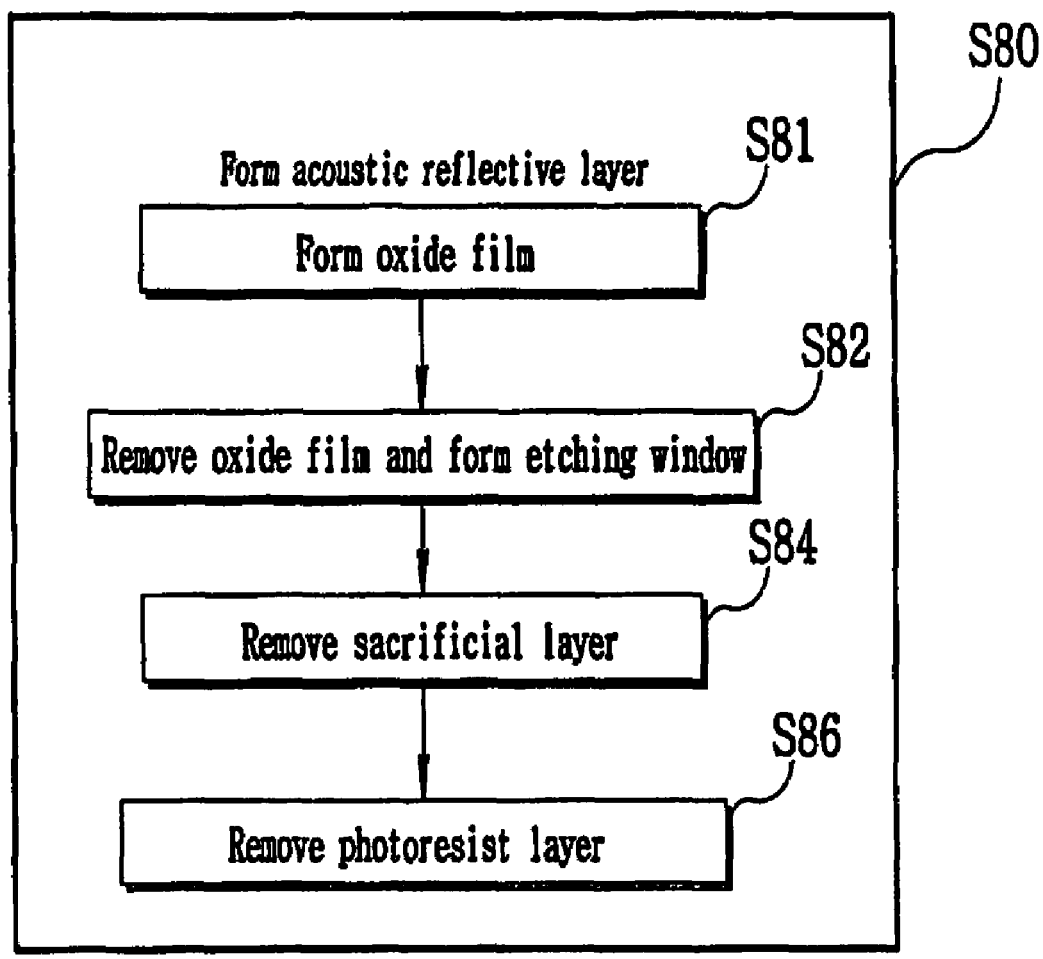
FIG. 6 is a block diagram illustrating another example of an acoustic reflective layer forming step in an embodiment of a method of manufacturing a film bulk acoustic wave device according to the present invention.

In the acoustic reflective layer forming step S80, if a silicon substrate is used as the substrate 2, it further includes a step S81 of depositing and forming the oxide film 4 on the entire substrate for each film bulk acoustic wave device cut in the cutting step S70; and a step S82 of removing the oxide film 4 formed on the photoresist layer 60 and forming the etching window 64, as shown in FIGS. 6 and 8.

In the foregoing, the oxide film 4 is deposited and formed in a thickness of hundreds of angstroms (Å) using, for example, a CVD deposition method.

If a substrate other than the silicon substrate is used as the substrate 2, the process of forming the oxide film 4 can be omitted.

Further, a method of manufacturing a the film bulk acoustic wave device according to an embodiment of the present invention includes, as shown in FIGS. 1, 3 and 8 to 9, includes a sacrificial layer forming step S10 of forming the sacrificial layer 50 of Poly-Si, Si or the like on the substrate 2; an oxide film forming step S20 of forming the thermal oxidation film 12 by oxidizing the sacrificial layer 50 in portions except for a portion where the acoustic reflective layer 8 is to be formed; a protecting film forming step S30 of forming the etch protecting film 10 of oxide, nitride, or the like in a predetermined thickness on the sacrificial layer 50; a lower electrode forming step S40 of forming the lower electrode 20 by depositing a conductive material in a predetermined pattern on the etch protecting film 10 and the thermal oxidation film 12; a piezoelectric thin film forming step S50 of forming the piezoelectric thin film 30 by depositing a material with a piezoelectric characteristic in a predetermined pattern on the lower electrode 20 and the thermal oxidation film 12; and an upper electrode forming step S60 of forming the upper electrode 40 by depositing a conductive material in a predetermined pattern on the piezoelectric thin film 30.

Although the preferred embodiments of the film bulk acoustic wave device and the methods of manufacturing the same according to the present invention have been described, the present invention is not limited to them and several variations may be made to the present invention from departing from the scope of claims, the detailed descriptions, and the accompanying drawings. Further, the variations also belong to the scope of the present invention.

With the film bulk acoustic wave device and manufacture method according to the present invention configured as described above, a thin lower electrode is formed and a piezoelectric thin film is formed on the etch protecting film or oxidation protective film formed on a silicon oxide film, a silicon nitride film, and the like having a very smooth surface, thereby improving the c-axis orientation of the piezoelectric thin film and resonance characteristics.

Thus, since the chemical mechanical polishing (CMP) process of two steps that has been needed in the conventional surface micromachining method is not needed, a manufacture process is very simple and production yield is also improved.

Since the surface of the etch protecting film or oxidation protective film composed of a silicon oxide film, a silicon nitride film, or the like according to the present invention is smoother than the surface that mirror surface polished by the conventional two-step CMP process, the quality of the piezoelectric thin film grown thereon is also improved and the resultant resonance characteristic is excellent.

Silicon substrate has the best surface smoothness, and is not smoothed like an original surface state even though any process is added whether depositing, etching, or CMP is made using the substrate. Thus, the smoothness is best when a portion of the silicon substrate is used as the sacrificial layer. The silicon oxide film and the silicon nitride film formed using a low pressure chemical vapor deposition (LPCVD), or the like has excellent smoothness.

If in the present invention, the portion of the silicon substrate is used as the sacrificial layer, the surface of the silicon substrate is smoother as compared to the conventional case where the sacrificial layer in the etching groove undergoes the two-step CMP process. (Processes such as depositing, etching, polishing, and the like obstruct the smoothness from being improved over an original surface smoothness.) Thus, in the method of manufacturing the film bulk acoustic wave device of the present invention, the conventional two-step CMP process may be omitted.

From comparison between processes of depositing the sacrificial layer on the silicon substrate and thermally oxidizing a portion thereof in the present invention and the conventional two-step CMP process, it can be seen that the present invention achieves the same effect only with the one-step CMP, resulting in a more simplified process. The conventional two-step CMP needs a rough machining (first step) and mirror machining (second step) while the present invention needs only a mirror machining step. For such a structure of the present invention, all insulating substrates with smooth and insulating characteristics are available.

Although in the two-step CMP the substrate groove is machined and then the sacrificial layer is deposited, the sacrificial layer is directly deposited on the silicon substrate (even except for direct use of the silicon substrate) in the present invention. Therefore, the sacrificial layer according to the present invention has a smoother plane.

The physical characteristic is poor because of discontinuity of the material characteristic of the sacrificial layer (i.e., resonance region) and the substrate region (i.e., electrode region) after the conventional two-step CMP process. On the other hand, in the device according to the partial thermal oxidation process suggested in the present invention, since the interface region has a gentle slope, sufficient physical endurance can be obtained due to the suppression of micro-cracks.

With the film bulk acoustic wave device and the manufacture method according to the present invention, the lower electrode and the upper electrode are formed in a multi-layer (dual) electrode structure, which makes it possible to improve the acoustic characteristic and the electrical conductive characteristic together.

What is most important among acoustic characteristics in the film bulk acoustic wave device using the acoustic reflective layer is acoustic loss. Such loss is due to a unique characteristic of a material itself, such as elastic viscosity of the material. Because the layer is used as an electrode, it must have excellent electrical conductivity so that electrical resistance is low. If the thickness of the electrode is thin, the acoustic characteristics become relatively less important while the electrical characteristics become more important. Accordingly, if a film bulk acoustic wave device configured in the form of a multi-layer electrode structure is manufactured according to the present invention, both the acoustic and electrical conductive characteristics can be improved.

Further, according to a method of manufacturing a film bulk acoustic wave device of the present invention, since the cutting process is conducted after the photoresist layer is coated with a protective film, residues or the like created upon cutting do not affect the film bulk acoustic wave device structure, and the process of removing the photoresist layer is a simply conducted cutting process, thereby achieving convenience, automation and facilitated mass production.

A method of depositing a resonance structure by partially thermally oxidizing the sacrificial layer or silicon substrate according to the present invention is a very simple method having a simplified process as compared to the existing manufacture process method in which a groove is formed on a conventional silicon substrate, a groove protective film is formed, the sacrificial layer is deposited, a two-step CMP process is carried out on the sacrificial layer, a support layer is formed back, and a resonance structure is formed thereon.

Moreover, with the film bulk acoustic wave device according to the present invention, since a significantly excellent smooth plane can be achieved without requiring a CMP process, most preferable solution can be suggested to a monolithic microwave integrated circuit (MMIC) and a radio frequency integrated circuit (RFIC).

What is claimed is:

1. A film bulk acoustic wave device, comprising:
   a substrate;
   a substrate protective film formed on said substrate;
   an acoustic reflective layer centrally forming a resonance region on the substrate protective film;
   an etch protecting film flatly formed on the acoustic reflective layer with silicon oxide or nitride in a thickness of hundreds of angstroms (Å);
   a thermal oxidation film forming an electrode region outside the resonance region on the substrate protective film; and
   a lower electrode partially formed on the resonance region and the electrode region and having a sloped distal end portion toward the resonance region of the thermal oxidation film;
   a piezoelectric thin film on the lower electrode; and
   an upper electrode on the piezoelectric thin film.

2. A film bulk acoustic wave device, comprising:
   a silicon substrate;
   an oxidation protective film or etch protecting film formed in a pattern of dividing a resonance region to form an acoustic reflective layer on the silicon substrate;
   a thermal oxidation film formed by partially thermally oxidizing the silicon substrate in an electrode region where the oxidation protective film or etch protecting film is not formed, said thermal oxidation film being sloped toward the resonance region;
   and a lower electrode, a piezoelectric thin film and an upper electrode on the thermal oxidation film.

3. The device as claimed in any one of claims 1 or 2, wherein after the thermal oxidation film is formed, the oxidation protective film is removed and the etch protecting film is formed of silicon oxide, nitride or the like in a thickness of hundreds to thousands of angstroms (Å) on the sacrificial layer from which the oxidation protective film is removed.

4. The device as claimed in any one of claims 1 or 2, wherein after the thermal oxidation film is formed, the oxidation protective film is used as the etch protecting film without being removed.

5. The device as claimed in any one of claims 1 or 2, wherein the thermal oxidation film is grown in a portion having no oxidation protective film, is not grown in a center portion where the oxidation protective film remains, and is formed in an inclined manner in an interface portion thereof, whereby the resonance region and the electrode region are interconnected with each other in a gentle slope.

6. The device as claimed in claim 1 wherein the lower electrode or upper electrode comprises:

a first electrode layer formed by depositing a conductive material having less acoustic loss and good electrical conductivity in a thickness of thousands of angstroms (.ANG.); and a second electrode layer formed by depositing a noble metal material having low electrical resistance and thus less loss due to the resistance in a thickness of hundreds of angstroms (.ANG.) or less on the first electrode layer to prevent the first electrode layer from being oxidized.

7. The device as claimed in claim 6, wherein the first electrode layer is formed of molybdenum, aluminum, silver or copper, and the second electrode layer is formed of platinum or gold.

* * * * *